United States Patent [19]

Sakitani et al.

[11] Patent Number: 4,520,421
[45] Date of Patent: May 28, 1985

[54] SPECIMEN SUPPORTING DEVICE

[75] Inventors: Yoshio Sakitani; Yoshihisa Minamikawa, both of Katsuta, Japan

[73] Assignee: Hitachi, Ltd., Tokyo, Japan

[21] Appl. No.: 521,610

[22] Filed: Aug. 9, 1983

[30] Foreign Application Priority Data

Aug. 11, 1982 [JP] Japan ................................ 57-138583

[51] Int. Cl.³ .......................................... H01T 20/00
[52] U.S. Cl. ...................................... 361/234; 269/903
[58] Field of Search ............... 361/234, 233, 230, 225; 250/492.2; 269/903

[56] References Cited

U.S. PATENT DOCUMENTS

| | | | |
|---|---|---|---|
| 3,916,270 | 10/1975 | Wachtler et al. | 361/234 |
| 3,983,401 | 9/1976 | Livesay | 250/492.2 |
| 4,184,188 | 1/1980 | Briglid | 269/903 X |
| 4,384,918 | 5/1983 | Abe | 361/234 X |

Primary Examiner—Harry E. Moose, Jr.
Attorney, Agent, or Firm—Antonelli, Terry & Wands

[57] ABSTRACT

A specimen support comprises a pair of specimen attracting portions each having an electrode on the lower side thereof through an electrically insulating member. The pair of specimen attracting portions is arranged in opposed relation to one side of the specimen to be attracted thereto and is made of semiconductive dielectric material. A voltage is applied between the pair of specimen attracting portions thereby to attract the specimen to the portions electrostatically.

26 Claims, 9 Drawing Figures

SPECIMEN SUPPORTING DEVICE

BACKGROUND OF THE INVENTION

The present invention relates to a specimen supporting device and more in particular to a specimen supporting device suitable for supporting a specimen within a vacuum chamber.

In an ion implanting apparatus known as a semiconductor fabricating device, a multiplicity of wafer targets are provided as specimens in an implanting chamber, and are implanted with ions while being sequentially relocated to predetermined positions. In view of the fact that the implanting chamber is required to be kept in vacuum, vacuum attracting means known as specimen holding or supporting means in the atmosphere cannot be used as specimen supporting means in the implanting chamber. For this reason, screwing means is generally used for supporting specimens in the implanting chamber. The problems of the screwing means are that it is difficult to fix specimens of different sizes on the one hand and the specimens are liable to be broken on the other hand.

A solution of these problems have been proposed by means of applying a voltage between a specimen and a specimen-attracting portion made of insulating member whereby the resulting electrostatic atractive force is used to support the specimen by attraction to the specimen attracting portion, as disclosed for example in U.S. Pat. No. 3,983,401 for supporting and securing target wafers for exposure to an electron pattern in electron projection systems. In order to obtain an attractive force equivalent to that of vacuum attraction (1 kg/cm$^2$ or a pressure almost equal to the atmospheric pressure) in this system, the specimen attracting portion is required to be made up of an insulating material several $\mu$m thick and having a breakdown voltage of more than 10$^5$ V/cm.

Although mica or SiO$_2$ may be used as the insulating material of the specimen attracting portion, it is practically very difficult to produce a mica or SiO$_2$ film of a fixed thickness of about several $\mu$m. This problem is soluble by thickening the film. Nevertheless, such a solution requires an increased applied voltage.

SUMMARY OF THE INVENTION

Accordingly, an object of the present invention is to provide a specimen supporting device comprising a specimen attracting portion thicker than the one made of insulating material for producing an electrostatic attractive force of predetermined magnitude with a lower applied voltage.

According to the present invention, there is provided a specimen supporting device comprising first and second specimen attracting portion made of semiconductive dielectric material adapted to contact one of the surfaces of a specimen, and means for applying a voltage between the specimen attracting portions thereby to attract the specimen to the first and second specimen attracting portion electrostatically.

DESCRIPTION OF THE PREFERRED EMBODIMENTS

Figure 1:
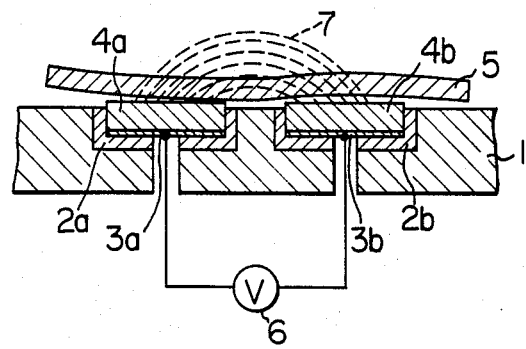
FIG. 1 is a longitudinal sectional view of the essential parts of a specimen supporting device illustrated for facilitating the understanding the principle of the present invention.

FIG. 1 is a diagram for facilitating the understanding the principle of the present invention. With reference to FIG. 1, a specimen supporting base 1 fixedly carries, through insulating members 2a and 2b, specimen attracting portion 4a and 4b of semiconductive dielectric material with electrodes 3a and 3b mounted on the lower sides thereof.

A specimen or target 5 is disposed on the upper side of the specimen attracting portions 4a and 4b. When a predetermined voltage is applied between the specimen attracting portions 4a and 4b from a power supply 6 under this condition, dielectric fluxes 7 directed from one to the other of the specimen attracting portions 4a and 4b through the target 5 are generated. Electron charges of a polarity opposite to the electrodes 3a and 3b are created in the lower sides of the specimen attracting portions 4a and 4b, while electron charges of the same polarity as those in the electrodes 3a and 3b are formed in the upper side thereof, so that electron charges of the polarity opposite to those in the upper sides of the specimen attracting portions 4a and 4b are formed in those surface portions of the target 5 which are in contact with the specimen attracting portions 4a and 4b. As a result, an electrostatic attractive force is generated between the target 5 and the specimen attracting portions 4a and 4b thereby to attract the specimen to the specimen attracting portions and support the former.

Figure 2:
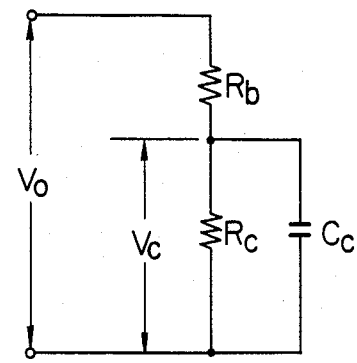
FIG. 2 is a diagram showing an equivalent circuit to FIG. 1.

Let the contact resistance between the target 5 and the specimen attracting portions 4a and 4b be Rc, the contact capacity therebetween be Cc, the resistance of the specimen attracting portions 4a and 4b be Rb, and the voltage applied between the specimen attracting portions 4a and 4b be Vo. An equivalent circuit of FIG. 1 is given as shown in FIG. 2. From FIG. 2, the voltage Vc across the contact resistance Rc is given as Vc=RcVo/(Rb+Rc)=Vo/[(Rb/Rc)+1].

If a mean gap between the target 5 and the specimen attracting portions 4a, 4b is assumed to be d, on the other hand, the electrostatic attractive force generated between the target 5 and the specimen attracting portions 4a, 4b is inversely proportional to d$^2$ and proportional to Vc$^2$.

The value Rc, as expressed by volume resistivity in $\Omega$·cm, is approximately several $\Omega$·cm. In the case where the specimen attracting portion 4a and 4b are made of insulating material, therefore, the value Rb, similarly expressed in volume resistivity, is about $10^{12}\Omega\cdot cm$. Since $Rb >> Rc$, $Vc \approx 0$ (V), indicating that substantially no electrostatic attractive force is generated. In order to generate an electrostatic attractive force, it is necessary to reduce the thickness of the specimen attracting portions 4a and 4b made of insulating material thereby to decrease resistance Rb, thus increasing the voltage Vc. Even when the specimen attracting portions 4a and 4b are reduced to 1 μm in thickness, however, the resistance Rb remains comparatively large at $10^8\Omega\cdot cm$.

Since the volume resistivity of the semiconductive dielectric member is about $10^4\Omega\cdot cm$ to $10^8\Omega\cdot cm$, on the other hand, Rb takes the value of $10^2$ to $10^4\Omega\cdot cm$ for the thickness of 1 μm of the specimen attracting portions 4a and 4b in the case where the portions 4a and 4b are made of a semiconductive dielectric material. This is indicative of the fact that in the case where the specimen attracting portions 4a and 4b are made of semiconductive dielectric material, the specimen attracting portions 4a and 4b may be made thick and the applied voltage low for obtaining a predetermined electrostatic attractive force unlike in the case in which the portions 4a and 4b are made of insulating material.

In the case where the specimen attracting portions 4a and 4b are made of semiconductive dielectric material instead of insulating material, the electron charge attributable to polarization of the specimen attracting portions 4a, 4b which may be caused by the voltage application are eliminated immediately after stopping the voltage application, thereby preventing the problem of dust or dirts attached.

Another advantage of the specimen attracting portions 4a and 4b made of semiconductive dielectric material is that the thickness of the specimen attracting portions 4a and 4b may be increased as compared with the portions 4a and 4b made of insulating material, thus solving the problem of dielectric breakdown of the specimen attracting portions 4a and 4b which otherwise might be caused by the requirement of the specimen attracting portions 4a and 4b, if made of insulating material, to be reduced in thickness.

It is also possible to attract and support the target 5 by applying a voltage between the specimen attracting portions 4a, 4b and the target 5. In this case, however, the target may be contaminated or broken on the one hand and is hard to handle on the other hand because of the requirement of an electrical conduction means to be inserted between the target 5 and the specimen attracting portions 4a, 4b.

If a voltage is applied between the specimen attracting portions 4a and 4b with which one side, namely, the lower side of the target 5 is adapted to be in contact as shown in FIG. 1, by contrast, the requirement of electrical conduction to the target 5 is eliminated, thus totally obviating the above-mentioned problem.

The specimen attracting portions 4a and 4b, which are independent of each other in FIG. 1, may alternatively be connected by means of the same semiconductive dielectric material.

The semiconductive dielectric material making up the specimen attracting portions 4a and 4b may be cellulose carbon or graphite. Further, the applied voltage may take AC instead of DC form.

Figure 3:
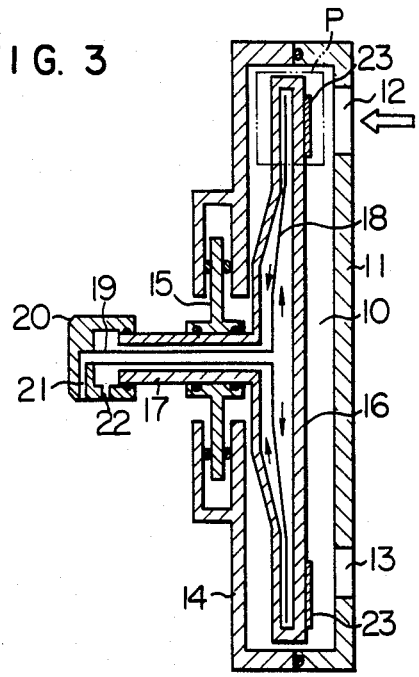
FIG. 3 is a longitudinal sectional view of the essential parts of an ion inplanting apparatus employing a specimen supporting device according to an embodiment of the present invention.
Figure 4:
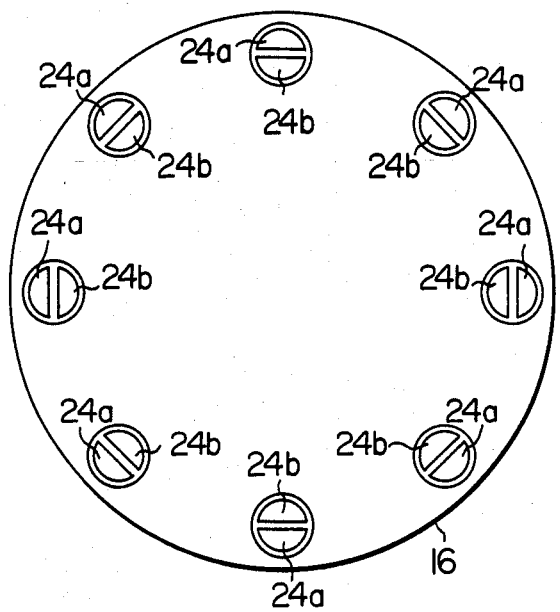
FIG. 4 is a right side view of a specimen supporting rotary base plate included in FIG. 3.
Figure 5:
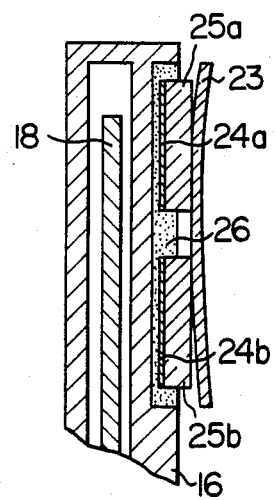
FIG. 5 is an enlarged view of the part P in FIG. 3.

The essential parts of an ion implanting apparatus using a specimen supporting device according to an embodiment of the present invention are shown in FIGS. 3 to 5. In these diagrams, an implanting chamber frame 11 making up an implanting chamber 10 includes an aperture 12 for passing an implanting ion beam in the direction of a large arrow and a vent 13 to be connected with a vacuum pump (not shown) for evacuating the implanting chamber 10.

The implanting chamber lid 14 defining part of the implanting chamber 10 and demountably fixed on the implanting chamber frame 11 in a manner resistant to vacuum is provided with a member 15 which is movable in a manner resistant to vacuum in a plane perpendicular to the implanting ion beam.

A rotary plate 16 as a specimen supporting base is arranged within the implanting chamber 10 and includes a rotary hollow shaft 17 passing through the movable member 15 in a vacuum-resistant manner. The rotary plate 16 is hollow and includes a circular partition plate 18 arranged in the hollow portion thereof. The partition plate 18 carries a fixed hollow shaft 19 which communicates with a hole at the central portion of the partition plate 18.

A fixed cooling head 20 includes a refrigerant entrance 21 and a refrigerant outlet 22. The fixed hollow shaft 19 is fixed on the fixed cooling head 20 to communicate with the refrigerant entrance 21, while the rotary hollow shaft 17 is engaged with the fixed cooling head 20 rotatably in a vacuum-resistant manner to communicate with the refrigerant outlet 22.

The rotary plate 16 is provided with eight specimen attracting supports equidistantly arranged along the circumference thereof, thereby to attract and support specimens or targets, namely, wafers 23 to be implanted with ions.

Each of the eight specimen attracting supports includes specimen attracting portions 25a and 25b made of a semiconductive dielectric material such as cellulose carbon or graphite which in turn has electrodes 24a and 24b at the bottom thereof. These specimen attracting portions are fixed on the rotary plate 16 by means of an electrically-insulating adhesive agent 26.

Figure 6:
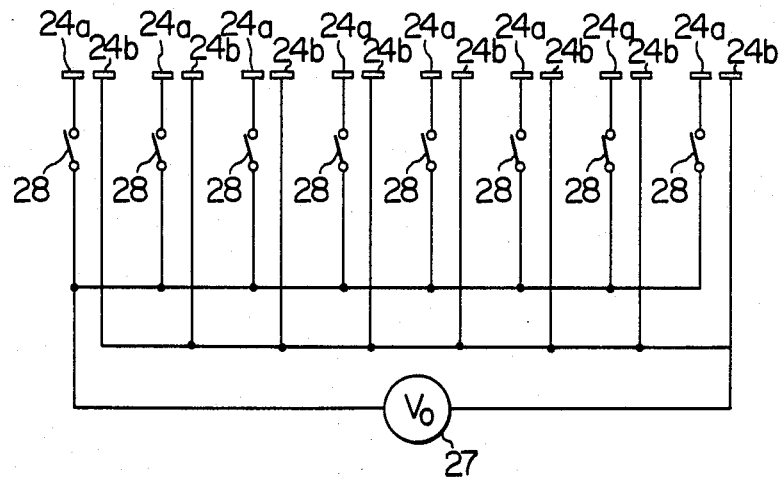
FIG. 6 shows an electrical circuit used with the embodiment of FIGS. 3 to 5.

As shown in FIG. 6, a voltage is applied from a powder supply 27 through the electrodes 24a and 24b between the specimen attracting portions 25a and 25b of the eight specimen attracting supports. This voltage application is effected independently for each specimen attracting support by means of switches 28.

In operation, the implanting chamber lid 14 is removed from the implanting chamber frame 11, and the targets 23 are disposed on the specimen attracting supports respectively. Under this condition, the switches 28 are closed so that the targets 23 are attracted to and supported on the specimen attracting supports respectively on the same principle as explained with reference to FIGS. 1 and 2.

Subsequently, the implanting chamber lid 14 is mounted on the implanting chamber frame 11 in vacuumresistant manner, and the implanting chamber 10 is evacuated by a vacuum pump (not shown) by way of the vent 13 to acheive a predetermined vacuum.

Under this condition, the rotary hollow shaft 17, hence, the rotary plate 16 is rotated. At the same time, the ion beam entering the implanting chamber 10 from the direction of the large arrow is caused to scan in the direction perpendicular to the page, while moving the movable member 15, hence, the rotary plate 16 in the direction perpendicular to the scanning of the ion beam at a predetermined rate. In this way, ions are impinged uniformly on each of the targets 23.

On the other hand, the cooling water which is a refrigerant is introduced from the refrigerant entrance 21 of the cooling head 20 and is discharged from the refrigerant outlet 22 through a path shown by small arrows. The targets 23 are thus cooled by the cooling water and an excessive temperature increase of the targets 23 which otherwise might be caused by ion implantation is prevented.

After ion implantation, the targets 23 may be removed, if desired, by demounting the implanting chamber lid 14 and opening the switches 28. If selected ones of the eight switches are opened, only the targets on the specimen attracting supports to which voltage application is stopped may be demounted while leaving the remaining targets attracted and supported.

The fixing means for the fixed cooling head 20, the rotating means for the rotary hollow shaft 17 and the moving means for the movable member 15 all of which are well known in the art are not shown in the drawings to facilitate the drawing and the explanation.

Figure 7:
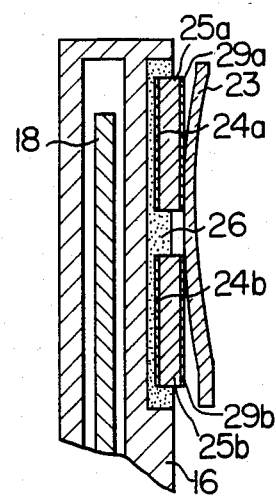
FIG. 7 is an enlarged view of the part P in FIG. 3 according to another embodiment corresponding to FIG. 5.

FIG. 7 shows another embodiment corresponding to the one of FIG. 5. In FIG. 7, reference numerals identical to those in FIG. 5 are used to designate the same component members as in FIG. 5.

The embodiment of FIG. 7 is different from that of FIG. 5 in that conductive films 29a and 29b of aluminum or the like are formed on the target 23 side of the specimen attracting portions 25a and 25b. In this embodiment, the conductive films 29a and 29b are of the polarity opposite to that of those surfaces of the specimen attracting portions 25a and 25b on which the films 29a and 29b are formed, and therefore the surface of the target 23 on the side of the conductive films has a polarity opposite to that of the surface thereof on the side of the specimen attracting portions in FIG. 5. Since the target 23 is subjected to electrostatic attractive force as in the case of FIG. 5, however, the target 23 is attracted to and supported on the conductive films 29a and 29b.

The conductive films 29a and 29b may be easily formed by, say, the method of vapor deposition, and the smooth surface thereof without any roughness may be obtained readily. Consequently, the electrostatic attractive force is expected to increase due to the decreased average gap between the target 23 and the conductive films 29a, 29b. In addition, the heat conductivity of the conductive films 29a and 29b which is high as compared with that of the semiconductive dielectric member possibly increase the heat-discharging effect of the target 23.

The specimen attracting portions 25a and 25b may alternatively be connected through the same semiconductive dielectric member instead of being independent of each other as in FIGS. 4, 5 and 7. Also, the number of the specimen attracting supports is not limited to eight but may be larger or smaller than eight as desired.

Figure 9:
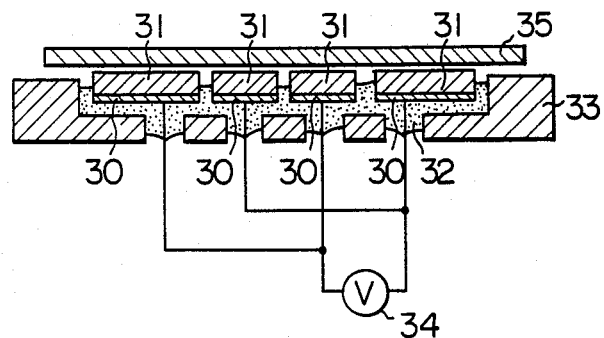
FIG. 9 is a sectional view taken along the line IX-IX' in FIG. 8.
Figure 8:
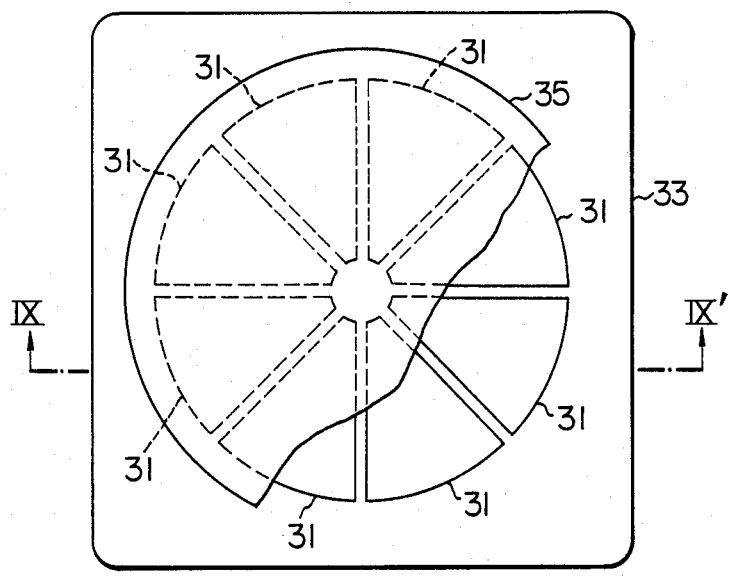
FIG. 8 is a plan view of still another embodiment of the specimen supporting device according to the present invention.

Still another embodiment of the specimen supporting device according to the present invention is shown in FIGS. 8 and 9.

Eight arcuate specimen attracting portions 31 each having an electrode at the bottom thereof and made of semiconductive dielectric material are arranged in a circle and bonded to a specimen supporting frame 33 through an electrically insulating adhesive agent 32. A voltage from a power supply 34 is applied to the electrodes 30 in such a manner that they have alternately opposite polarities. As a result, dielectric fluxes are created through a specimen 35 between each adjacent pair of the arcuate specimen attracting portions, so that the specimen 35 is attracted to and supported on the arcuate specimen attracting portions 31 on the same principle as in FIGS. 1 and 2.

This embodiment may be used as specimen supporting means for the scanning type electron microscope or the like in which a specimen is arranged in vacuum for observation or analysis.

The present invention is explained above with reference to the preferred embodiments. It should be understood that the present invention may be presented by those skilled in the art in a variety of modifications or alterations without departing from the spirit of the invention.

We claim:

1. A specimen supporting device comprising means for supporting a specimen, said means including first and second specimen attracting portions arranged in opposed relation to one side of said specimen, and made of semiconductive dielectric material, and means for applying a voltage between said first and second specimen attracting portions in a manner to electrostatically attract said specimen to said first and second specimen attracting portions.

2. A specimen supporting device according to claim 1, wherein said first and second specimen attracting portions have a volume resistivity substantially in the range from $10^4$ to $10^8$ $\Omega$·cm.

3. A specimen supporting device according to claim 2, wherein said first and second specimen attracting portions are made of cellulose carbon.

4. A specimen supporting device according to claim 2, wherein said first and second specimen attracting portions are made of graphite.

5. A specimen supporting device according to claim 1, wherein those surfaces of said first and second specimen attracting portions which are on the side of said specimen are made of conductive material.

6. A specimen supporting device according to claim 2, wherein those surfaces of said first and second specimen attracting portions which are on the side of said specimen are made of conductive material.

7. A specimen supporting device according to claim 5, wherein said conductive material is aluminum.

8. A specimen supporting device according to claim 6, wherein said conductive material is aluminum.

9. A specimen supporting device comprising means for supporting a plurality of specimens, said means including a plurality of specimen attracting and supporting portions for supporting said specimens by attraction, each of said plurality of the specimen attracting and supporting portions including first and second specimen attracting portions, said first and second specimen attracting portions being arranged in opposed relation to one side of the corresponding one of said specimens, said first and second specimen attracting portions being made of semiconductive dielectric material, and means for applying a voltage between said first and second specimen attracting portions of each of said plurality of specimen attracting and supporting portions.

10. A specimen supporting device according to claim 9, wherein said first and second specimen attracting portions have a volume resistivity substantially in the range from $10^4$ to $10^8$ $\Omega$·cm.

11. A specimen supporting device according to claim 9, wherein those surfaces of said first and second specimen attracting portions which are on the side of said specimen are made of conductive material.

12. A specimen suppotting device according to claim 10, wherein those surfaces of said first and second specimen attracting portions which are on the side of said specimen are made of conductive material.

13. A specimen supporting device according to claim 9, wherein said plurality of specimen attracting and supporting portions are arranged in a predetermined circle.

14. A specimen supporting device according to claim 10, wherein said plurality of specimen attracting and supporting portions are arranged in a predetermined circle.

15. A specimen supporting device according to claim 11, wherein said plurality of specimen attracting and supporting portions are arranged in a predetermined circle.

16. A specimen supporting device according to claim 12, wherein said plurality of specimen attracting and supporting portions are arranged in a predetermined circle.

17. A specimen supporting device according to claim 9, wherein said voltage application means includes means for selecting the application of the voltage between said first and second specimen attracting portions for each specimen attracting and supporting portion.

18. A specimen supporting device according to claim 10, wherein said voltage application means includes means for selecting the application of the voltage between said first and second specimen attracting portions for each specimen attracting and supporting portion.

19. A specimen supporting device according to claim 9, wherein those surfaces of said first and second specimen attracting portions which are on the side of said specimen are made of conductive material, and said voltage application means includes means for selecting the application of the voltage between said first and second specimen attracting portions for each specimen attracting and supporting portion.

20. A specimen supporting device according to claim 10, wherein those surfaces of said first and second specimen attracting portions which are on the side of said specimen are made of conductive material, and said voltage application means includes means for selecting the application of the voltage between said first and second specimen attracting portions for each specimen attracting and supporting portion.

21. A specimen supporting device according to claim 9, wherein said plurality of specimen attracting and supporting portions are arranged in a predetermined circle, and said voltage application means includes means for selecting the application of the voltage between said first and second specimen attracting portions for each specimen attracting and supporting portion.

22. A specimen supporting device according to claim 10, wherein said plurality of specimen attracting and supporting portions are arranged in a predetermined circle, and said voltage application means includes means for selecting the application of the voltage between said first and second specimen attracting portions for each specimen attracting and supporting portion.

23. A specimen supporting device according to claim 9, wherein those surfaces of said first and second specimen attracting portions which are on the side of said specimen are made of conductive material, said plurality of specimen attracting and supporting portions being arranged in a predetermined circle, said voltage application means including means for selecting the application of the voltage between said first and second specimen attracting portions, for each specimen attracting and supporting portion.

24. A specimen supporting device according to claim 10, wherein those surfaces of said first and second specimen attracting portions which are on the side of said specimen are made of conductive material, said plurality of specimen attracting and supporting portions being arranged in a predetermined circle, said voltage application means including means for selecting the application of the voltage between said first and second specimen attracting portions, for each specimen attracting and supporting portion.

25. A specimen supporting device comprising means for supporting a specimen, said means including a plurality of specimen attracting portions arranged in opposed relation to said specimen around a predetermined position, said specimen attracting portions being made of semiconductive dielectric material, and power supply means connected to said plurality of specimen attracting portions so that said specimen attracting portions are of alternately opposite polarities for attracting said specimen electrostatically to said specimen attracting portions.

26. A specimen supporting device according to claim 25, wherein said plurality of specimen attracting portions have a volume resistivity substantially in the range from $10^4$ to $18^8$ $\Omega$·cm.

* * * * *